United States Patent [19]

Chinone et al.

[11] Patent Number: 4,905,060
[45] Date of Patent: Feb. 27, 1990

[54] LIGHT EMITTING DEVICE WITH DISORDERED REGION

[75] Inventors: Naoki Chinone, Chofu; Hisao Nakashima, Minoo; Makoto Okai, Kodaira; Shinji Tsuji, Iruma, all of Japan

[73] Assignee: Hitachi, Ltd., Tokyo, Japan

[21] Appl. No.: 198,198

[22] Filed: May 25, 1988

[30] Foreign Application Priority Data

May 29, 1987 [JP] Japan .................................. 62-131125

[51] Int. Cl.⁴ ............................................. H01L 33/00
[52] U.S. Cl. .......................................... 357/17; 357/16; 357/4; 357/63; 357/91
[58] Field of Search ..................... 357/17, 16, 4, 91, 63

[56] References Cited

U.S. PATENT DOCUMENTS

| 4,569,721 | 2/1986 | Hayakawa et al. | 357/17 X |
| 4,599,728 | 4/1989 | Alavi et al. | 357/16 X |
| 4,625,226 | 11/1986 | Antell | 357/16 X |
| 4,630,083 | 12/1986 | Yamakoshi | 357/16 X |
| 4,712,219 | 12/1987 | Yano et al. | 357/17 X |

FOREIGN PATENT DOCUMENTS

| 54-107285 | 8/1979 | Japan | 357/17 X |
| 56-103485 | 8/1981 | Japan | 357/17 X |
| 58-53873 | 3/1983 | Japan | 357/17 X |

OTHER PUBLICATIONS

Fukuzawa et al, "GaAlAs Buried Multiquantum Well Lasers Fabricated by Diffusion-Induced Disordering," Appl. Phys. Lett. 45(1), Jul. 1, 1984, pp. 1-3.

Primary Examiner—William Mintel
Attorney, Agent, or Firm—Kenyon & Kenyon

[57] ABSTRACT

A light emitting device has a multiple layer film structure such as a multiple quantum well (MQW) structure which is made of an indium system compound semiconductor not containing phosphorus, wherein part of a region or regions of the multiple film structure is (are) a disordered region or regions disordered by introduction of an inpurity.

17 Claims, 2 Drawing Sheets

LIGHT EMITTING DEVICE WITH DISORDERED REGION

BACKGROUND OF THE INVENTION

1. Field of the Invention

This invention relates to the art of light emitting devices, and more particularly to a light emitting device which will be suitable for use in optical communication and optical measurement. The light emitting device in accordance with the present invention includes semiconductor lasers and various light emitting diodes.

2. Description of the Prior Art

It is well known that when Zn, Ga or Si is diffused or ion-implanted locally into a multiple layer ultra-thin film made of InAlAs having different compositions and is then heat-treated, the constituent elements cause mutual migration due to the diffusion of the additive element and a film having a uniform composition on an average can be obtained. This is referred to as "disordering" by diffusion. A light emitting device having a structure wherein optical distribution is confined by use of the difference of refractive indices between the multiple layer film portion and the portion having the uniform composition by utilizing the disordering described above has been reported. Refer, for example, to Appln. Phys. Letts. 45 (1984), pp. 1–3. This is an effective method of accomplishing a refractive index confinement structure by a planar process such as diffusion and ion implantation.

In an optical communication system, a light emitting device having a wavelength ranging from 1.1 to 1.6 $\mu$m is of particular importance, but it is not easy to cause disordering by use of an InGaAsP system material that has been widely utilized in this wavelength band. Therefore, there arose the problem that confinement of optical distribution by utilizing disordering cannot be realized by use of the 1.1–1.6 $\mu$m wavelength band.

SUMMARY OF THE INVENTION

In the course of studies on light emitting devices having an emission wavelength primarily in the 1.1 to 1.6 $\mu$m band, the inventors of the present invention have found that among In system compound semiconductors closely associated with the wavelength band described above, the compound semi-conductors whose diffusion make disordering extremely difficult to generate are limited to those which contain P as one of their constituent elements such as InP, InGaP, InGaAsP, InAlAs, and so forth. In other words, the inventors of the present invention have found out that P as one of the constituent elements of the compound semiconductors is the element which remarkably impedes disordering of the multiple layer film structure of such compound semiconductors.

Furthermore, the inventors of the present invention have realized that light emission in the 1.1 to 1.6 $\mu$m band is possible by adjusting the composition and thickness of the multiple layer film grown on an InP substrate or the like, such as InAlAs/InGaAs, InAlAs/InGaAlAs, InGaAlAs/InGaAs, such that the multiple layer film grown does not contain P. If the multiple layer film contains In but does not contain P, disordering by diffusion as well as light emission in the 1.1 to 1.6 $\mu$m band become possible.

When Zn, Si, Al, Ga or like element is diffused, the migration of constituent elements occurs in a multiple layer film which is from 100 to 200 Å thick so that the multiple layer film is averaged to produce the film having a uniform composition. The inventors of the present invention have found that if P exists in the multiple layer film, such a phenomenon hardly occurs. On the other hand, InGaAsP is one of the most promising materials as the material having an emission wavelength in the 1.1 to 1.6 $\mu$m band, but the inventors have realized that light emission is possible by use of InGaAlAs or the like and that light emission in this wavelength band is possible in a multiple layer film of an ultra-thin film of InAlAs/InGaAs or the like, or in other words, in a so-called "quantum well structure", too, by controlling the thickness of the InGaAs layer or the like. The present invention is disclosed on the basis of these findings. The materials described above do not contain P but all contain In in common. When these materials are used, disordering is generated by diffusion or ion implantation of elements and optical confinement by the difference of refractive indices becomes possible.

In accordance with one aspect of the present invention, there is provided a light emitting device which consists of compound semiconductors containing In as one of their constituent elements and substantially no P and having a multiple film structure as part of the region or regions of which are disordered by impurity diffusion. Such light emitting devices include, as the compound semiconductors forming the multiple layer film structure, ternary or quaternary In system III-V group compounds such as InGaAs, InGaAlAs, InAlAs, InGaSb, InGaAlSb, InAlSb, and the like. Besides Zn, Ga and Si, impurity elements which are contained in the disordered region of the multiple layer film structure by diffusion include those elements which are used for ordinary impurity diffusion. Diffusion, ion implantation and doping under formation of the multiple layer film structure are available as means for introducing the impurity elements described above into the multiple layer film structure. The multiple layer film structure in the present invention includes a super-lattice structure and a so-called quantum well structure (so-called "MQW"). Disordering of the multiple film structure is most effective when the film of each compound semiconductor layer constituting the multiple layer film structure is from 30 to 200 Å thick and more preferably from 50 to 100 Å thick.

In accordance with a more limited aspect of the present invention, there is provided a light emitting device having the disordered region of the multiple layer film structure described above as a cladding region for optical confinement. Such a light emitting device includes those in which the cladding region for optical confinement is disposed separately from a light emitting layer and those in which the cladding region is disposed at part of one or more regions of the light emitting layer.

In accordance with another aspect of the present invention, there is provided a light emitting device which includes a region, which is part of one or more regions of the multiple layer film structure consisting of In system III-V group compound semiconductors not containing P, and which is disordered by impurity diffusion, as a region having a refractive index smaller than that of the light emitting region. Such a region of the light emitting device having a smaller refractive index than that of the light emitting region includes regions which reduce optical permeation, such as claddings of semiconductor lasers, for example.

In accordance with still another aspect of the present invention, there is provided a light emitting device including one which is part of a region or more regions of the multiple layer film structure consisting of In system III-V group compound semiconductors not containing P, and which is disordered by introduction of an impurity, as a region having an energy band gap caused by disordering different from the energy band gap of the region which is not disordered. The difference of the energy band gaps described above can be utilized as a carrier confinement structure of the light emitting device.

One of the advantages of the present invention is that there can be obtained a light emitting device capable of easily forming a disordered region of a multiple layer film structure consisting of In system compound semiconductors.

Another advantage of the present invention is that there can be obtained a light emitting device which has a wavelength of from 1.1 to 1.6 $\mu$m and effects optical confinement by utilizing disordering of the multiple layer film structure.

Still another advantage of the present invention is that there can be obtained a light emitting device which effects optical confinement by utilizing the difference of refractive indices in the semiconductor regions and which is particularly suitable for optical communication. The light emitting device of the present invention, which is suitable for optical communication, can oscillate a ray of light having a wavelength in the 1.1 to 1.6 $\mu$m band, has a low threshold current value and has high selectivity of oscillation modes.

Still another advantage of the present invention is that there can be obtained easily a light emitting device for effecting carrier confinement by utilizing the difference of energy band gaps inside semiconductor regions.

The above and other objects and advantages of the present invention will become more apparent to those skilled in the art from the following detailed description when taken in conjunction with the accompanying drawings.

BRIEF DESCRIPTION OF THE DRAWINGS

The present invention may take various forms in various parts and arrangements of parts or in various steps and arrangements of steps. The drawings are only for the purpose of illustrating the preferred embodiments of the invention but are not to be construed as limiting the invention.

DETAILED DESCRIPTION OF THE PREFERRED EMBODIMENTS

One embodiment of the present invention, wherein a light emitting device of the invention is applied to a semiconductor laser, will be described with reference to FIG. 1.

Figure 1:
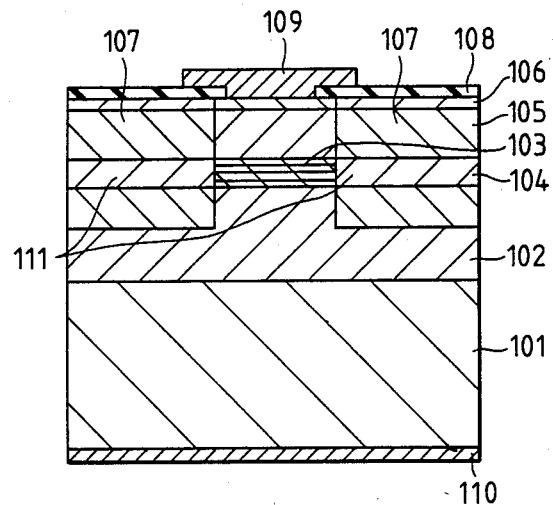
FIG. 1 is a view showing a sectional structure of a semiconductor laser in accordance with one embodiment of the present invention.

FIG. 1 shows the sectional structure of the semiconductor laser in a plane vertical to the direction of a resonance cavity of the semiconductor laser.

A p-type InP cladding layer 102 (1 $\mu$m thick), an undoped InGaAlAs/InGaAs super lattice layer 103 (InGaAlAs layer=100 Å thick; InAlAs=100 Å thick; each consisting of five layers), an n-type InP cladding layer 105 (1.5 $\mu$m thick) and an n-type InGaAs cap layer 106 (0.5 $\mu$m thick) are sequentially laminated on a p-type InP substrate 101 by MOCVD (Metal Organic Chemical Vapor Deposition). Thereafter, Zn is diffused into the region 107 by selective diffusion. Since part of the region 111 of the super lattice layer 104 is disordered with diffusion of Zn as an impurity element at this time, it turns to an InGaAlAs layer having an average composition. Thereafter, an insulating film 108 is deposited and a AuGeNi-Au electrode 109 is vacuum deposited. Finally, a Cr-Au electrode 110 is vacuum deposited on the back of the p-type InP substrate 101, and the whole is cut off into chips by cleavage and scribing.

When a current is caused to flow through this device, the carrier is injected into the InGaAs layer of the super lattice layer 103 and light is emitted. The light emission wavelength is 1.55 $\mu$m. The laser beam is confined by the difference of refractive indices between the region 103 and the region 104 and shows a fundamental transverse mode. In this embodiment, the injected carrier is confined by the difference of the energy band gaps between the InGaAs layer of the region 103 and the region 104 and contributes to efficient laser oscillation.

In this embodiment, since the region 111 of the super lattice, which is to be diffused by Zn diffusion, does not contain P as the constituent element of the semiconductor crystal, Zn diffusion proceeds promptly. Therefore, optical confinement and carrier confinement can be effected effectively. Incidentally, there might be the possibility that a trace amount of P is contained in the region 111, such as the unexpected mixture of P as an impurity during the growth of the super lattice layer 104, but it does not impede the present invention unless P is contained substantially one of constituent elements of the semiconductor crystal. The impurity such as Zn or the like can still be diffused rapidly in such a semiconductor multiple layer film structure.

It is possible to obtain a semiconductor laser having a greater optical output by burying an optical guide layer having a greater refractive index than that of the cladding layer 104 or 105 between the active layer 103 and the cladding layer 104 or between the active layer 103 and the cladding layer 105 in FIG. 1, through growth of a compound such as an n- or p-type InAlAs, or the like.

In this embodiment, the diffusion region is disposed at the part of region or regions of the active layer of the semiconductor laser, but the present invention is not particularly limited thereto but embraces those embodiments wherein other portions are disordered. The following will represent such an example.

Figure 2:
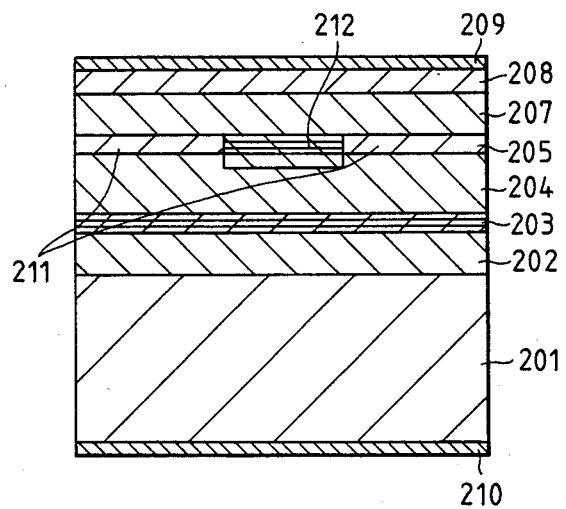
FIG. 2 is a view showing the sectional structure of the semiconductor laser in accordance with another embodiment of the present invention.

Another embodiment of the present invention, wherein the light emitting device of the invention is applied to the semiconductor laser, will be described with reference to FIG. 2. FIG. 2, shows the sectional structure of the semiconductor laser in a plane vertical to the direction of the resonance cavity of the semiconductor laser.

An n-type InP cladding layer 202 (1 $\mu$m thick), an undoped InGaAsP/InP super lattice layer 203 (InGaAsP=100 Å thick; InP=100 Å thick; each consisting of five layers), a p-type InP cladding layer 204 (0.2 $\mu$m thick) and a Si-doped InAlAs/InGaAs super lattice layer 205 (InAlAs=100 Å thick; InGaAs=100 Å thick; each consisting of ten layers) are grown sequentially on an n-type InP substrate 201 by MOCVD. Next, Be ions are implanted only into the region 212 of the drawing and are heat-treated. In this instance, the region 205 into which Be ions are implanted is not disordered but the other regions 211 are disordered due to introduced Si. Thereafter, a p-type InP cladding layer 207 (1 μm thick) and a p-type InGaAs cap layer 208 are laminated sequentially. Next, after a Cr-Au electrode 209 and a AuGeNi-Au electrode 210 are vacuum deposited. Chips are separated off by cleavage and scribing.

When a current is caused to flow through this device, a carrier is injected into the InGaAsP layer in the super lattice layer 203 and light is emitted. The laser beam is confined in the region below the region 212 due to the difference of the refractive indices between the region 211 and the region 212. This embodiment provides the advantage that control of the composition ratio, thickness or the number of layers of the super lattice layer 205 to obtain a desired difference of refractive indices can be made separately from control for efficient laser oscillation or control of the wavelength. Furthermore, in this case, the InGaAsP/InP super lattice layer 203 as the active layer may consist of a single layer of InGaAsP (0.1 μm thick).

Though heat treatment for diffusing introduced Si is carried out before the growth of the cladding layer 207 in this embodiment, it would be obvious to those skilled in the art that heat treatment may be carried out after the growth of the cladding layer 207 or the cap layer 208. In this embodiment, this heat treatment can be carried out without any problem simultaneously with the growth of the layers such as the semiconductor layer 207 or 208 which is to be formed after the growth of the super lattice layer 205. Furthermore, an optical output can be increased by disposing an optical guide layer in this embodiment, too, in the same way as in the foregoing embodiment.

In the first and second embodiments of the invention described above, an impurity such as Zn or Si is introduced into the multiple layer film structure (by diffusion in Embodiment 1 and by doping in Embodiment 2) and is diffused by subsequent heat treatment in order to cause disordering. As described already, however, it is possible to introduce the impurity element for disordering into the multiple layer film structure by ion implantation and to diffuse the element by subsequent heat-treatment for the purpose of disordering the multiple layer film structure. In this case, the ions of the impurity element may be implanted after the growth of the super lattice layers 104, 205, for example. It is also possible to selectively implant the impurity ions into the super lattice layer at relatively high energy after a separate semiconductor layer (e.g. 105 or 106, or 207 or 208) is formed on the semiconductor layer 104, 205.

The embodiments given above represent the cases where the light emitting device of the present invention is applied to a semiconductor laser, and a next embodiment will represent in detail the case where the present invention is applied to another light emitting device.

Figure 3A:
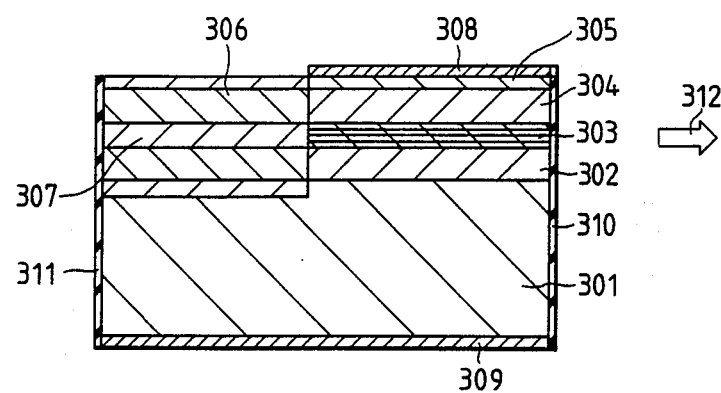
FIGS. 3A and 3B are views showing the sectional structure of a light emitting diode in accordance with still another embodiment of the present invention.

The embodiment of the prevention which is applied to a light emitting diode will be described with reference to FIG. 3A. This drawing shows a cross section of an end plane emission type light emitting diode in a plane vertical to the light emitting end plane. An optical output 312 is picked up from the right side in the drawing to the outside.

An n-type InAlAs layer 302 (Te-doped, 2 μm thick), an InGaAs/InAlAs multiple quantum well layer 303 (InGaAs layer=100 Å thick; InAlAs layer=100 Å thick; ten layers of each, laminated alternately), a p-type InAlAs layer 304 (Zn-doped, 2 μm thick) and a p-type InGaAs layer 305 (Zn-doped, 0.5 μm thick) are sequentially grown on an n-type InP substrate 301 (Sn-doped, 100 μm thick) by MOCVD or MBE (Molecular Beam Epitaxy). Next, Zn is diffused into the region 306 so that the quantum well layer is changed to an InGaAlAs layer 307 having an average composition by disordering. Thereafter, a p-electrode 308 and an n-electrode 309 are vacuum deposited and non-reflection coating films 310, 311 of silicon nitride are deposited to the end plane by sputtering. In this structure, the quantum well structure does not exist in the region 306 but the InGaAlAs layer 307 having a greater forbidden band width than that of the InGaAs layer in the quantum well layer 303 is formed. Therefore, even when a current is caused to flow between the electrodes, very little laser oscillation occurs. Since the non-reflection coating films are deposited to both end planes in this embodiment, optical feedback occurs only slightly and this also impedes laser oscillation. Therefore, it is possible to accomplish an end plane emission type light emitting diode having a high output. The optical output of 3 mW can be obtained without laser oscillation when a 100 mA current is caused to flow.

Figure 3B:
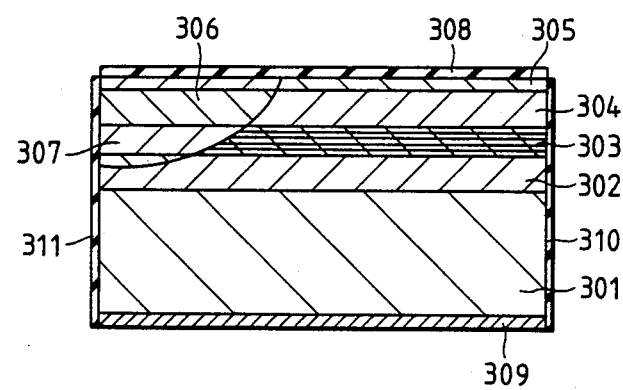

In this embodiment, the optical output can be taken out from the upper side plane or lower side plane in FIG. 3 by making at least one of the electrodes 308 and 309 transparent or by disposing an etching portion for taking out the optical output. In this case, a high output can be obtained by replacing 310 and 311 by the reflective films. Though the diffusion region 306 is shown as the rectangular region in the drawing, the present invention is not limited thereto but the structure such as shown in FIG. 3B may also be employed. It is of course possible to disorder the multiple layer film structure by ion implantation or doping besides diffusion and subsequent heat treatment as described already with reference to the first and second embodiments.

Although the present invention has thus been described with reference to the preferred embodiments thereof, various modifications and alterations will occur to those skilled in the art upon reading and understanding the present invention. It is intended that the invention be construed as including all such alterations and modifications in so far as they come with the scope of the appended claims or equivalent thereof.

What is claimed is:

1. A light emitting device comprising:
   a semiconductor substrate;
   a plurality of semiconductor layers stacked on said semiconductor substrate, being made of compound semiconductors which include indium substantially but not phosphorus substantially, and having a disordered region formed by introducing impurities into the semiconductor layers; and
   a pair of electrodes for injecting carriers into said semiconductor layers so as to emit light.

2. The light emitting device as set forth in claim 1, wherein one of said plurality of semiconductor layers is an active layer.

3. The light emitting device as set forth in claim 2, wherein said active layer comprises a multiple layer structure.

4. The light emitting device as set forth in claim 1, wherein said impurities are at least one species of elements selected from a group consisting of Zn, Al, Ga and Si.

5. The light emitting device as set forth in claim 1, wherein said semiconductor compound is at least one semiconductor compound selected from III-V compound semiconductors.

6. The light emitting device as set forth in claim 1, wherein said semiconductor compound is at least one member selected from a group consisting of InGaAs, InGaAlAs, InAlAs, InAlSb, InGaSb and InGaAlSb.

7. The light emitting device as set forth in claim 3, wherein said multiple layer structure comprises a plurality of layers each having a thickness of not less than 30 Å and not greater than 200 Å.

8. The light emitting device as set forth in claim 1, wherein introduction of said impurities into said semiconductor layers is accomplished by diffusion of said impurities.

9. The light emitting device as set forth in claim 1, wherein introduction of said impurities into said semiconductor layers is accomplished by ion-implantation of said impurities.

10. The light emitting as set forth in claim 1, wherein introduction of said impurities into said semiconductor layers is accomplished by epitaxial doping of said impurities into said semiconductor layers with the formation of said semiconductor layers.

11. A light emitting device comprising:
a semiconductor substrate; and
a region comprising a multiple layer structure having at least one disordered region therein;
wherein said multiple layer structure has multiple layers made of a semiconductor compound containing indium and substantially no phosphorous as a constituent element thereof, and said disordered region is formed by diffusion of impurities in said multiple layer structure.

12. A light emitting device comprising:
a semiconductor substrate;
a plurality of semiconductor layers formed on said substrate, comprising an active layer which emits light by injected carriers and a multiple layer structure which has at least one disordered region, wherein said multiple layer structure is made of a semiconductor compound containing indium and substantially no phosphorous as a constituent element of said semiconductor compound and said disordered region has a greater refractive index than that of at least one species of said layers in said multiple layer structure so as to confine light emitted from said active layer; and
a pair of electrodes for injecting the carriers into said active layer.

13. The light emitting device as set forth in claim 12, wherein said active layer is the multiple layer structure.

14. A light emitting device comprising:
a semiconductor substrate; and
a plurality of semiconductor layers formed on said substrate, comprising an active layer which emits light by injected carriers and a multiple layer structure which includes a disordered region, wherein said multiple layer structure comprises a semiconductor compound containing indium and substantially no phosphorous as a constituent element of said semiconductor compound, and said disordered region has a greater energy band gap than that of at least one species of said layers in said multiple layer structure so as to confine the carriers in said active layer.

15. The light emitting device as set forth in claim 14, wherein said impurity element is introduced by a method selected from a group consisting of diffusion, injection and doping.

16. The light emitting device as set forth in claim 14, wherein said compound semiconductor film is a compound selected from a group consisting of any of InGaAs, InGaAlAs, and InAlAs.

17. A light emitting device comprising:
a light emitting region emitting light in accordance with injected carriers therein; and
a disordered region formed by introducing impurities into a plurality of semiconductor layers which are formed by stacked structure of a plurality of compound semiconductor materials including indium but not phosphorous.

* * * * *

UNITED STATES PATENT AND TRADEMARK OFFICE
CERTIFICATE OF CORRECTION

PATENT NO. : 4,905,060

DATED : 27 February 1990

INVENTOR(S) : Naoki CHINONE et al.

It is certified that error appears in the above-identified patent and that said Letters Patent is hereby corrected as shown below:

| Column | Line | |
|---|---|---|
| 3 | 3 | After "including" insert --a region, which is part of--; after "one" delete "which is part of a region". |
| 4 | 38 | After "substantially" insert --as--; before "constituent" insert --the--. |
| 5 | 8 | After "and" change "a" to --an--. |
| 5 | 60 | Change "prevention" to --invention-- |
| 6 | 48 | Change "with" to --within--. |
| 7 | 23 | After "emitting" insert --device--. |
| 8 | 27 | Change "14," to --17,--. |
| 8 | 31 | Change "14," to --17,--. |

Signed and Sealed this

Eighth Day of October, 1991

Attest:

HARRY F. MANBECK, JR.

*Attesting Officer*   *Commissioner of Patents and Trademarks*